(12) United States Patent
Miyagoshi et al.

(10) Patent No.: US 11,101,317 B2
(45) Date of Patent: Aug. 24, 2021

(54) METHOD OF MANUFACTURING ELEMENT ARRAY AND METHOD OF REMOVING SPECIFIC ELEMENT

(71) Applicant: TDK CORPORATION, Tokyo (JP)

(72) Inventors: Toshinobu Miyagoshi, Tokyo (JP); Seijiro Sunaga, Tokyo (JP); Osamu Shindo, Tokyo (JP); Yasuo Kato, Tokyo (JP)

(73) Assignee: TDK CORPORATION, Tokyo (JP)

( * ) Notice: Subject to any disclaimer, the term of this patent is extended or adjusted under 35 U.S.C. 154(b) by 0 days.

(21) Appl. No.: 16/713,513

(22) Filed: Dec. 13, 2019

(65) Prior Publication Data

US 2020/0227468 A1  Jul. 16, 2020

(30) Foreign Application Priority Data

Dec. 14, 2018 (JP) .............................. JP2018-234755

(51) Int. Cl.
*B32B 43/00* (2006.01)
*H01L 27/15* (2006.01)
*C09J 201/00* (2006.01)
*H01L 33/00* (2010.01)
*B32B 38/10* (2006.01)

(52) U.S. Cl.
CPC .......... *H01L 27/156* (2013.01); *C09J 201/00* (2013.01); *H01L 33/0095* (2013.01); *B32B 38/10* (2013.01); *B32B 43/006* (2013.01); *C09J 2301/416* (2020.08); *C09J 2301/502* (2020.08); *Y10S 156/924* (2013.01); *Y10S 156/931* (2013.01); *Y10S 156/937* (2013.01); *Y10S 156/941* (2013.01); *Y10S 156/942* (2013.01); *Y10T 156/1137* (2015.01); (Continued)

(58) Field of Classification Search
CPC . B32B 38/10; B32B 43/006; Y10T 156/1137; Y10T 156/1158; Y10T 156/1917; Y10T 156/1939; Y10T 156/924; Y10T 156/93; Y10T 156/931; Y10T 156/937; Y10T 156/941; Y10T 156/942; Y10S 156/924; Y10S 156/93; Y10S 156/931; Y10S 156/937; Y10S 156/941; Y10S 156/942
See application file for complete search history.

(56) References Cited

U.S. PATENT DOCUMENTS

2006/0007297 A1    1/2006  Doi et al.
2016/0124316 A1*   5/2016  Markle .................. G03B 27/42
                                                         355/67
(Continued)

FOREIGN PATENT DOCUMENTS

JP    2006-41500 A    2/2006
JP    2015-177028 A   10/2015
(Continued)

*Primary Examiner* — Mark A Osele
*Assistant Examiner* — Nickolas R Harm
(74) *Attorney, Agent, or Firm* — Oliff PLC (57) ABSTRACT

In a method of manufacturing an element array, prepared is an adhesive sheet in which elements are arranged in a predetermined array on an adhesive layer. A specific element among the arrayed elements is removed from the adhesive sheet by radiating a laser to the specific element. The arrayed elements are directly or indirectly transferred onto a mounting substrate.

17 Claims, 4 Drawing Sheets

(52) U.S. Cl.
CPC .... *Y10T 156/1158* (2015.01); *Y10T 156/1917* (2015.01); *Y10T 156/1939* (2015.01)

(56) References Cited

U.S. PATENT DOCUMENTS

| | | |
|---|---|---|
| 2017/0263811 A1 | 9/2017 | Lou et al. |
| 2017/0358478 A1* | 12/2017 | Thothadri ........... H01L 21/6835 |
| 2018/0047608 A1 | 2/2018 | Hirao |

FOREIGN PATENT DOCUMENTS

| | | |
|---|---|---|
| JP | 2017-539088 A | 12/2017 |
| WO | 2016-158264 A1 | 10/2016 |

\* cited by examiner

METHOD OF MANUFACTURING ELEMENT ARRAY AND METHOD OF REMOVING SPECIFIC ELEMENT

BACKGROUND OF THE INVENTION

The present invention relates to a method of manufacturing an element array formed by arraying display elements (e.g., LED elements) or so and to a method of removing a specific element.

As display devices, proposed is a display device constituting a display element array formed by arraying multiple light emitting elements (LED elements). In conventional display devices using LED elements, LED elements that emit blue, green, or red light are formed on a semiconductor substrate and are thereafter arrayed in matrix on a display screen, and a driving wiring is formed thereon.

To array the elements formed on the semiconductor substrate at a predetermined position on the display device, a light-emitting diode element is transferred by a widely used method of arranging elements at a desired position using vacuum suction. The wiring is formed using a wire bonding technology or so.

The LED elements are manufactured using a semiconductor material whose raw material is expensive, such as gallium arsenide (GaAs) based material, gallium indium phosphorus (GaInP) based material, and gallium nitride (GaN) based material, and are thereby preferably small for reduction in manufacturing cost per element.

However, it is not easy to form a desired wiring by suctioning micro light emitting elements in a vacuum and arraying the elements at a position corresponding to a display screen, and it is also difficult to improve a position accuracy of the element array. Then, proposed is a technique of selectively peeling micro light emitting diode elements formed in equal intervals on a substrate and transferring the elements onto another substrate (for example, see Patent Document 1).

In a conventional method of transferring a display element as shown in Patent Document 1, however, an array of display elements formed on an element-formation substrate can, for example, be transferred onto a mounting substrate, but a no-good element may also be transferred. It is not easy to remove only a specific element after the element array is mounted on the mounting substrate, and it is further difficult to replace only the specific element.

In addition, the method of Patent Document 1 is a method of transferring elements by peeling them from a substrate with laser radiation from behind the substrate and is thereby hard to transfer only a specific element if the elements are small.

Patent Document 1: JP200641500 (A)

BRIEF SUMMARY OF INVENTION

The present invention has been achieved under such circumstances. It is an object of the invention to provide a method of easily removing only a specific element even if elements arranged in a predetermined array are small and a method of manufacturing an element array excluding a specific element.

To achieve the above object, a method of manufacturing an element array according to the present invention includes the steps of:

preparing an adhesive sheet in which elements are arranged in a predetermined array on an adhesive layer;

removing a specific element among the arrayed elements from the adhesive sheet by radiating a laser to the specific element; and directly or indirectly transferring the arrayed elements onto a mounting substrate.

The present inventors have found that a no-good element is easily removed while the predetermined array is maintained using the adhesive sheet (elements are arranged in a predetermined array on an adhesive layer of an adhesive sheet by, for example, a method of transferring a predetermined array of elements formed on an element-formation substrate onto the adhesive layer of the adhesive sheet). That is, the present inventors have found that a direct laser radiation to only the specific element determined to be no-good removes the radiated element in a flip manner from the adhesive layer. At this time, the array of the good elements is maintained. The adhesive layer is not very damaged at a position corresponding to the removed element, and a good element is easily disposed again at this position. Incidentally, for example, an element array is acceptable without disposing a good element.

In the manufacturing method according to the present invention, the good elements attached in a predetermined array on the adhesive sheet are directly or indirectly transferred on the mounting substrate, and an element array can thereby be manufactured with the predetermined array being maintained without using a vacuum suction pickup device or so. Incidentally, the direct transfer means that the adhesive sheet is used as it is, and the indirect transfer means that the elements are transferred from an adhesive sheet to another adhesive sheet for transfer or other members and are thereafter transferred on the mounting substrate. Incidentally, the element array can easily be transferred on the mounting substrate from the adhesive sheet.

In the method of manufacturing an element array according to the present invention, even if the elements arranged in a predetermined array are small, only a no-good element is easily removed, and an element array without the no-good specific element can easily be manufactured.

The manufacturing method according to the present invention may further include a step of attaching another good element onto the adhesive layer of the adhesive sheet at a vacant position from which the specific element is removed.

The manufacturing method according to the present invention may further include the steps of:

forming the elements in a predetermined array on an element-formation substrate; and transferring the elements formed in the predetermined array on the element-formation substrate onto the adhesive layer of the adhesive sheet.

The manufacturing method according to the present invention may further include a step of inspecting each of the elements formed in the predetermined array on the element-formation substrate.

Instead, the manufacturing method according to the present invention may further include a step of inspecting each of the elements formed in the predetermined array on the adhesive layer of the adhesive sheet.

Preferably, the element determined to be no-good is radiated by the laser in a radiation area having a rectangular spot shape fitted to a plane shape of the element. When the laser is radiated in such a manner, only the specific element is easily removed from the adhesive sheet without affecting other nearby elements.

Preferably, the element determined to be no-good is radiated by the laser in an area including an entire plane shape of the element. When the laser is radiated in such a manner, the specific element is easily removed from the adhesive sheet.

The laser has an output power and a wavelength determined so that the specific element is flipped away from the adhesive sheet by the laser radiation with preferably three or less shots, more preferably two shots or less, still more preferably one shot. The smaller the number of shots is, the less the adhesive layer is damaged, and the less the good elements near the element to be removed are likely to be damaged.

Preferably, the laser has a wavelength of 532 nm or less (more preferably, 266 nm or less). When such a laser is radiated, only the specific element is easily removed from the adhesive sheet without affecting other nearby elements.

A method of removing a specific element according to the present invention includes the steps of:

preparing an adhesive sheet in which elements are arranged in a predetermined array on an adhesive layer; and radiating a laser to a specific element among the elements arranged in the predetermined array so as to remove the specific element from the adhesive sheet and to leave the other elements on the adhesive sheet.

In the method of removing a specific element according to the present invention, even if the elements arranged in a predetermined array are small, only a specific element, such as a no-good element, is easily removed.

Preferably, the specific element is radiated by the laser in a radiation area having a rectangular spot shape fitted to a plane shape of the specific element. When the laser is radiated in such a manner, only the specific element is easily removed from the adhesive sheet without affecting other nearby elements.

Preferably, the specific element is radiated by the laser in an area including an entire plane shape of the specific element. When the laser is radiated in such a manner, the specific element is easily removed from the adhesive sheet.

The laser has an output power and a wavelength determined so that the specific element is flipped away from the adhesive sheet by the laser radiation with preferably three or less shots, more preferably two shots or less, still more preferably one shot. The smaller the number of shots is, the less the adhesive layer is damaged, and the less other elements (e.g., good elements) near the element to be removed are likely to be damaged.

Preferably, the laser has a wavelength of 532 nm or less (more preferably, 266 nm or less). When such a laser is radiated, only the specific element is easily removed from the adhesive sheet without affecting other nearby elements.

DETAILED DESCRIPTION OF INVENTION

Hereinafter, the present invention is explained based on an embodiment shown in the figures.

Figure 1:
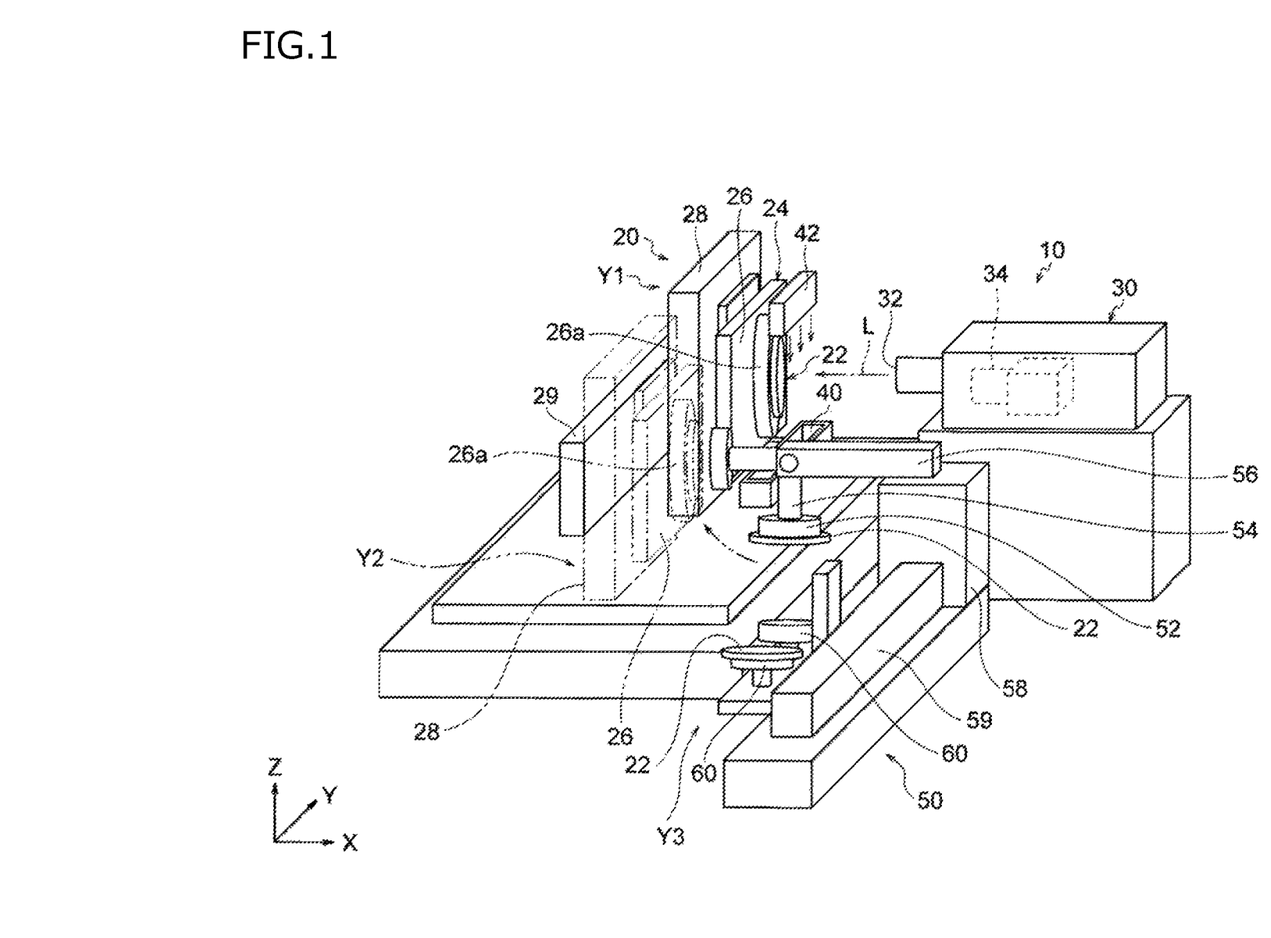
FIG. 1 is a schematic perspective view illustrating a main part of an apparatus used for a method of manufacturing an element array according to an embodiment of the present invention.

As shown in FIG. 1, an apparatus 10 for manufacturing an element array according to an embodiment of the present invention includes an apparatus 20 for removing a specific element and a substrate attachment apparatus 50. The removal apparatus 20 can remove a no-good specific element. The substrate attachment apparatus 50 attaches a substrate onto a substrate stage 24 of the removal apparatus 20.

The apparatus 20 for removing a specific element includes the substrate stage 24 and a laser radiation device 30. The substrate stage 24 is a substrate hold means for holding a substrate 22. The laser radiation device 30 emits a laser light L to the surface of the substrate 22.

The substrate stage 24 includes a Z-axis movable table 26, a Y-axis movable base 28, and a rail 29. The Z-axis movable table 26 includes an installation stand 26a for detachably holding the substrate 22 and is attached movably in the Z-axis direction onto the Y-axis movable base 28. The installation stand 26a may be provided with a suction mechanism for detachably holding the substrate.

The Y-axis movable base 28 is movable between a processing position Y1 and an attachment position Y2 along the rail 29 in the Y-axis direction. The substrate stage 24 has a movement mechanism in which the substrate 22 is moved along a plane substantially perpendicular to the laser light L emitted from an emitting part 32 of the laser radiation device 30 in the X-axis direction by the movement of the Z-axis movable table 26 in the Z-axis direction and the movement of the Y-axis movable base 28 in the Y-axis direction. In the present embodiment, the X-axis and the Y-axis are parallel to the horizontal plane, the Z-axis is parallel to the vertical line, and the X-axis, the Y-axis, and the Z-axis are perpendicular to each other.

Figure 3:
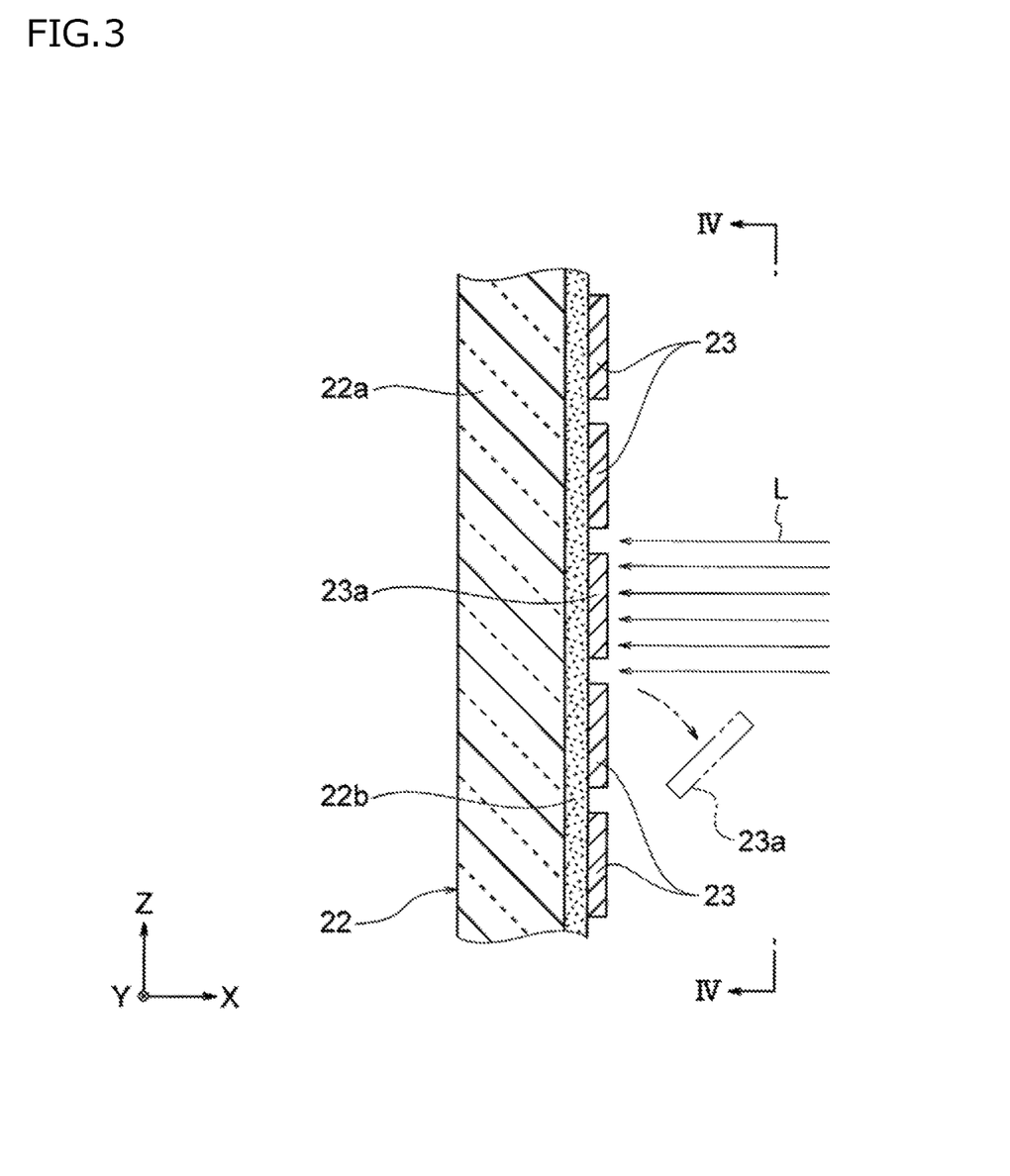
FIG. 3 is a cross-sectional view of a main part illustrating the next step of FIG. 2.

As shown in FIG. 3, the substrate 22 is formed from a substrate body 22a and an adhesive layer 22b formed on the substrate body 22a. The substrate body 22a may be a flexible adhesive sheet by itself or may be a rigid substrate on which an adhesive sheet (an adhesive layer is formed) is adhered. The adhesive layer 22b is made of an adhesive resin (e.g., natural rubber, synthetic rubber, acrylic based resin, silicone rubber) and preferably has a thickness of 1.0-10.0 μm.

Figure 4:
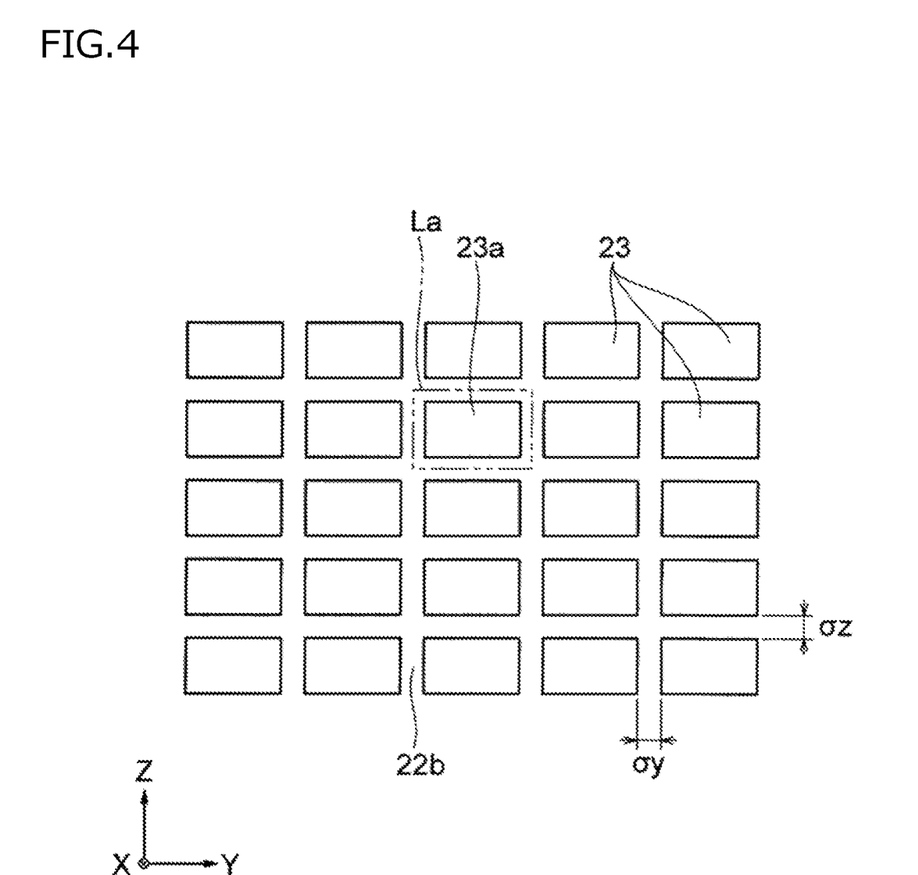
FIG. 4 is a plane view of an element array along the IV-IV line shown in FIG. 3.

In the present embodiment, as shown in FIG. 4, elements 23 are detachably attached in matrix onto the surface of the adhesive layer 22b formed on the substrate body 22a with a predetermined interval δy in the Y-axis direction and a predetermined interval δz in the Z-axis direction. The elements 23 are not limited and are, for example, a display element. Incidentally, the display element is not limited to an element for displaying screen and may be an element for illumination (e.g., light emitting element (LED element), fluorescent element). The elements 23 are not limited to a display element and may be an electronic device (e.g., ceramic capacitors, chip inductors) or a semiconductor element.

In the present embodiment, for example, the elements 23 are a micro light emitting element (micro LED element) having a plane size of, for example, 5 μm×5 μm to 200 μm×300 μm. The predetermined interval δy and the predetermined interval δz may be the same as or different from each other and are, for example, 5-100 μm.

The laser light L emitted from the emitting part 32 of the laser radiation device 30 shown in FIG. 1 is substantially perpendicularly radiated to the adhesive layer 22b shown in FIG. 3 and is radiated to only a specific element 23a of the elements 23 arranged in a predetermined array as shown in FIG. 4. Thus, the laser radiation device 30 shown in FIG. 1 may have a radiation mask for directly radiating the laser light L to only the specific element 23a in a radiation area La having a rectangular spot shape fitted to a plane shape of the specific element 23a or in an area including an entire plane shape of the specific element 23a shown in FIG. 4.

The laser radiation device 30 shown in FIG. 1 may contain an image sensor 34. The image sensor 34 may be disposed separately from the laser radiation device 30 and can take an image of an array of the elements 23 shown in FIG. 4. The image sensor 34 may take an image of the elements 23 shown in FIG. 4 for visual inspection of each of the elements 23. The movement of the substrate stage 24 shown in FIG. 1 may be controlled so that the laser light L is radiated to only the specific element 23a determined to be no-good in the visual inspection. For example, the substrate 22 is moved in the plane direction (in the Z-axis or the Y-axis) by controlling the movement of the substrate stage 24 shown in FIG. 1 so that the laser light L is radiated to only the specific element 23a.

As shown in FIG. 1, a collection mechanism 40 is disposed below the substrate 22 attached on the installation stand 26a at the processing position Y1. As mentioned below, the collection mechanism 40 has an upper opening for receiving the specific element 23a shown in FIG. 3 falling from the substrate 22. The upper opening has a width in the Y-axis direction that is larger than an outer diameter of the substrate 22 and has a width in the X-axis direction that is larger than a thickness of the substrate 22. The upper opening is large enough to receive the specific element 23a shown in FIG. 3 falling from any position on the surface of the substrate 22.

The collection mechanism 40 may contain a suction mechanism for suctioning ambient gas. A gas blow mechanism 42 is disposed above the substrate 22 attached on the installation stand 26a and is disposed over the collection mechanism 40 in the Z-axis direction. The gas blow mechanism 42 blows a gas (e.g., air, inert gas), and this blown gas flows downward in the Z-axis into the upper opening of the collection mechanism 40 shown in FIG. 1 via the surface of the specific element 23a attached on the substrate 22 shown in FIG. 3.

The substrate attachment apparatus 50 shown in FIG. 1 is disposed at the attachment position Y2 located next to the removal apparatus 20 in the Y-axis direction located at the processing position Y1 and includes a substrate suction instrument 52. The substrate suction instrument 52 is an instrument for transporting the substrate 22 moved on a temporary stand with the state of FIG. 3 through the step of FIG. 2 onto the installation stand 26a moved at the attachment position Y2.

The substrate suction instrument 52 is fixed at a tip of a rotation rod 54 and is installed rotatably at a tip of a support rod 56. The support rod 56 is fixed to the upper end of the Y-axis movable block 58 and is reciprocable between the attachment position Y2 and a delivery position Y3 in the Y-axis direction. Incidentally, the rotation rod 54 may be extendible for allowing the substrate suction instrument 52 to move in the Z-axis direction, or the substrate attachment apparatus 50 may partially or wholly be movable in the Z-axis direction. The support rod 56 may be movable in the X-axis direction.

Next, explained is a method of manufacturing an element array according to an embodiment of the present invention, particularly a method of manufacturing a light emitting element (LED element) array.

Figure 2:
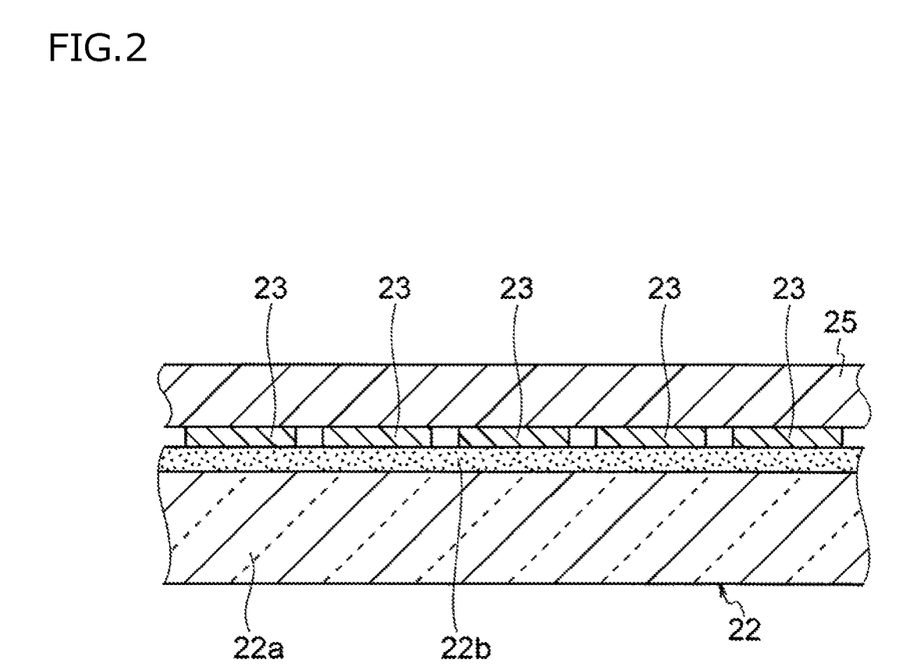
FIG. 2 is a cross-sectional view of a main part illustrating a step of a method of manufacturing an element array according to an embodiment of the present invention.

First of all, an element array where the elements 23 (e.g., LED elements) are arranged in matrix is formed on the element-formation substrate 25 shown in FIG. 2. The substrate 25 used for manufacturing the element array differs depending upon, for example, kind of the elements 23 (e.g., blue light emitting elements, red light emitting elements, green light emitting elements), but is a sapphire substrate, a glass substrate, a GaAs substrate, a SiC substrate, or the like.

After the array of the elements 23 is formed on the substrate 25, as shown in FIG. 2, the substrate 25 with the elements 23 is pushed against the adhesive layer 22b formed on the substrate 22, and only the array of the elements 23 is peeled from the substrate 25 and transferred on the adhesive layer 22b by laser lift method or so. Incidentally, the array of the elements 23 is transferred not only by laser lift method, but may be transferred using difference in adhesive strength, heat peeling, or the like.

The substrate 22 on which the array of the elements 23 is transferred is transported on a temporary installation stand 60 disposed at the delivery position Y3 shown in FIG. 1. The substrate 22 transported on the temporary installation stand 60 is attached by the substrate attachment apparatus 50 onto the installation stand 26a of the table 26 moved at the attachment position Y2. The substrate 22 attached at the attachment position Y2 is moved to the processing position Y1.

At the processing position Y1, each of the elements 23 arranged in array as shown in FIG. 4 is subjected to a visual inspection using, for example, the image sensor 34 so as to find a no-good (unnecessary) specific element 23a. Incidentally, the inspection may be carried out before the substrate 22 is placed at the processing position Y1.

Next, as shown in FIG. 3 and FIG. 4, the movement of the substrate stage 24 shown in FIG. 1 is controlled so that the laser light L is radiated to only the specific element 23a in the radiation area La. At this time, the movement of the substrate stage 24 may be controlled while the position of the specific element 23a is being detected using the image sensor 34.

Next, the laser light L is radiated to only the specific element 23a in the radiation area La having a rectangular spot shape fitted to a plane shape of the specific element 23a. The radiation of the laser light L in such a manner easily removes only the specific element 23a from the adhesive layer 22b without affecting other nearby elements 23.

The laser light L is radiated to the specific element 23a in an area where the entire plane shape of the specific element 23a is contained. The radiation of the laser light L in such a manner easily removes the specific element 23a from the adhesive layer 22b.

The laser light L has an output power and a wavelength determined so that the specific element 23a is flipped away from the adhesive layer 22b by the radiation of the laser light L with preferably three shots or less, more preferably two shots or less, still more preferably one shot. The smaller the number of shots is, the less the adhesive layer 22b is damaged, and the less the good elements 23 near the element 23a to be removed are likely to be damaged.

Preferably, the laser light L has a wavelength of 532 nm or less (more preferably, 266 nm or less). The radiation of such a laser light L easily removes only the specific element 23a from the adhesive layer 22b without affecting other nearby elements 23. Specifically, the laser radiation device 30 shown in FIG. 1 is a YAG laser, a carbon dioxide laser, an excimer laser, a UV laser, or the like. In view of laser wavelength and energy for removal, the laser radiation device 30 shown in FIG. 1 is preferably a YAG laser.

In the method of the present embodiment, as mentioned above, the elements 23 are arranged and adhered in a predetermined array onto the adhesive layer 22b by a method (e.g., a method of transferring the elements 23 formed in a predetermined array on the element-formation substrate 25 shown in FIG. 2 onto the adhesive layer 22b of the substrate 22), and the specific element 23a determined to be no-good is thereby easily removed while the predetermined array is maintained. That is, the direct radiation of the laser light L to only the specific element 23a as shown in FIG. 3 removes the radiated element 23a in a flip manner from the adhesive layer 22b. At this time, the array of the good elements 23 is maintained.

Incidentally, the reason why the radiated element 23a is removed in a flip manner from the adhesive layer 22b is that the energy applied to the element 23a by laser radiation reaches the interface between the element 23a and the adhesive layer 22b and peels the adhesion between the adhesive layer 22b and the element 23a as a physical stress, or that the energy applied to the element 23a by laser radiation functions as an external force directly acting on the element, which peels the element 23a.

The adhesive layer 22b is not very damaged at a position corresponding to the removed element 23a, and the good element 23 can be disposed again at this position by a normal method (e.g., transfer method, suction transportation method, stamp method).

Incidentally, for example, a display device (including an illumination device) having an element array may be acceptable without disposing the good element 23 again at a position where the specific element 23a is removed. For example, when the elements 23 have a small size, there may be no problem with a display device (including an illumination device) having an element array as a whole even if a specific one element 23a among two or more arrayed elements 23 is missing.

In the manufacturing method of the present embodiment, the good elements 23 attached on the substrate 22 in a predetermined array are directly or indirectly transferred on a mounting substrate (not illustrated), and an element array (e.g., micro LED element array) can thereby be manufactured with the predetermined array being maintained without using a vacuum suction pickup device or so. Incidentally, the direct transfer means that the adhesive sheet is used as it is, and the indirect transfer means that the elements 23 are transferred from an adhesive sheet to another adhesive sheet for transfer or other members and are thereafter transferred on the mounting substrate.

In the manufacturing method of the present embodiment, even if the elements 23 arranged in a predetermined array are as small as 5 μm×5 μm or less, only the specific element 23a is easily removed, and an element array from which the no-good element 23a is removed can easily be manufactured. The manufacturing method of the present embodiment may further include a step of attaching another good element 23 onto the surface of the adhesive layer 22b at a vacant position where the specific element 23a is removed.

Incidentally, the present invention is not limited to the above-mentioned embodiment and may variously be changed within the scope of the present invention.

In the above-mentioned embodiment, for example, the substrate is held to be parallel to a plane including the Y-axis and the Z-axis, and the laser light L is emitted in the horizontal direction parallel to the Y-axis, but the present invention is not limited to this. For example, the substrate 22 may be held to be parallel to a plane including the X-axis and the Y-axis, and the laser light L may be emitted in a direction parallel to the Z-axis. As long as the surface of the substrate 22 is substantially perpendicular to the laser light L, the surface of the substrate 22 is not limited to a plane including the Y-axis and the Z-axis or a plane including the X-axis and the Y-axis, and the substrate 22 may be held to be parallel to a plane at any angle to the horizontal plane.

The elements 23 may be inspected by a device other than the image sensor 34. After the elements 23 are formed on the substrate 25 shown in FIG. 2, for example, each of the elements 23 may be inspected visually by an image sensor (not illustrated) so as to determine the no-good element 23, and this array position may be memorized. After that, at the processing position Y1 shown in FIG. 1, a laser light may be radiated to only the specific element 23a at the memorized array position so as to remove only the specific element 23a. Incidentally, the inspection of each of the elements 23 is not only a visual inspection, but an electric inspection or so.

In the above-mentioned embodiment, the movement of the substrate stage 24 shown in FIG. 1 is controlled so that the laser light L is radiated to only the specific element 23a, but the radiation direction of the laser light L may be controlled so that the laser light L is radiated to only the specific element 23a using, for example, galvanometer mirror and Fθ lens. The mechanism with galvanometer mirror and Fθ lens may be similar to the mechanism with laser scanning, but controlling the movement of the substrate stage 24 can further simplify an apparatus configuration as a whole.

DESCRIPTION OF THE REFERENCE NUMERICAL

10 . . . apparatus for manufacturing element array
20 . . . apparatus for removing specific element
  22 . . . substrate (adhesive sheet)
    22a . . . substrate body
    22b . . . adhesive layer
  23 . . . element
    23a . . . specific element
  24 . . . substrate stage
  25 . . . element-formation substrate
  26 . . . Z-axis movable table
    26a . . . installation stand
  28 . . . Y-axis movable base
  29 . . . rail
30 . . . laser radiation device
  32 . . . laser emitting part
  34 . . . image sensor
40 . . . collection mechanism
42 . . . gas blow mechanism
50 . . . substrate attachment apparatus
  52 . . . substrate suction instrument
  54 . . . rotation rod
  56 . . . support rod
  58 . . . Y-axis movable block
  59 . . . rail
60 . . . temporary installation stand
L . . . laser light
La . . . radiation area
Y1 . . . processing position
Y2 . . . attachment position
Y3 . . . delivery position

What is claimed is:

1. A method of manufacturing an element array, comprising the steps of:
    preparing an adhesive sheet in which elements are arranged in a predetermined array on an adhesive layer;
    removing a specific element among the arrayed elements from the adhesive sheet by directly radiating a laser on a surface of the specific element; and directly or indirectly transferring the arrayed elements onto a mounting substrate.

2. The method according to claim 1, further comprising a step of attaching a good element different from the specific element onto the adhesive layer of the adhesive sheet at a vacant position from which the specific element is removed.

3. The method according to claim 1, further comprising the steps of:
forming the elements in a predetermined array on an element-formation substrate; and
transferring the arrayed elements formed on the element-formation substrate onto the adhesive layer of the adhesive sheet.

4. The method according to claim 3, further comprising a step of inspecting each of the elements formed in the predetermined array on the element-formation substrate.

5. The method according to claim 1, further comprising a step of inspecting each of the elements formed in the predetermined array on the adhesive layer of the adhesive sheet.

6. The method according to claim 1, wherein the elements are display elements.

7. The method according to claim 1, wherein the specific element is radiated by the laser in a radiation area having a rectangular spot shape fitted to a plane shape of the specific element.

8. The method according to claim 1, wherein the specific element is radiated by the laser in an area including an entire plane shape of the specific element.

9. The method according to claim 1, wherein the laser has an output power and a wavelength determined so that the specific element is flipped away from the adhesive sheet by the laser radiation with three or less applications of the laser radiation.

10. The method according to claim 9, wherein the laser has a wavelength of 532 nm or less.

11. The method according to claim 1, wherein the surface is an exposed surface.

12. A method of removing a specific element, comprising the steps of:
preparing an adhesive sheet in which elements are arranged in a predetermined array on an adhesive layer; and
directly radiating a laser on a surface of a specific element among the elements arranged in the predetermined array so as to remove the specific element from the adhesive sheet and to leave the other elements on the adhesive sheet.

13. The method according to claim 12, wherein the specific element is radiated by the laser in a radiation area having a rectangular spot shape fitted to a plane shape of the specific element.

14. The method according to claim 12, wherein the specific element is radiated by the laser in an area including an entire plane shape of the specific element.

15. The method according to claim 12, wherein the laser has an output power and a wavelength determined so that the specific element is flipped away from the adhesive sheet by the laser radiation with three or less applications of the laser radiation.

16. The method according to claim 15, wherein the laser has a wavelength of 532 nm or less.

17. The method according to claim 12, wherein the surface is an exposed surface.

* * * * *